(12) United States Patent
Kim et al.

(10) Patent No.: US 10,074,644 B2
(45) Date of Patent: Sep. 11, 2018

(54) INTEGRATED SEMICONDUCTOR DEVICE HAVING ISOLATION STRUCTURE FOR REDUCING NOISE

(71) Applicant: Magnachip Semiconductor, Ltd., Cheongju-si (KR)

(72) Inventors: Hyun Chul Kim, Chilgok-gun (KR); Hee Baeg An, Cheongju-si (KR); In Chul Jung, Daegu (KR); Jung Hwan Lee, Cheongju-si (KR); Kyung Ho Lee, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/685,697

(22) Filed: Aug. 24, 2017

(65) Prior Publication Data

US 2018/0182747 A1 Jun. 28, 2018

(30) Foreign Application Priority Data

Dec. 23, 2016 (KR) ........................ 10-2016-0178432

(51) Int. Cl.
| | | |
|---|---|---|
| H01L 29/78 | (2006.01) | |
| H01L 29/06 | (2006.01) | |
| H01L 29/08 | (2006.01) | |
| H01L 43/06 | (2006.01) | |
| H01L 29/66 | (2006.01) | |
| H01L 21/762 | (2006.01) | |
| H01L 31/113 | (2006.01) | |
| H01L 27/02 | (2006.01) | |
| H01L 27/092 | (2006.01) | |
| H01L 27/22 | (2006.01) | |

(52) U.S. Cl.
CPC ...... *H01L 27/0248* (2013.01); *H01L 27/0922* (2013.01); *H01L 27/0924* (2013.01); *H01L 27/22* (2013.01)

(58) Field of Classification Search
CPC ........................ H01L 29/0653; H01L 29/0878
See application file for complete search history.

(56) References Cited

U.S. PATENT DOCUMENTS

| | | | |
|---|---|---|---|
| 6,747,294 B1 | 6/2004 | Gupta et al. | |
| 2015/0021687 A1* | 1/2015 | Tamura | H01L 29/7816 257/343 |
| 2016/0079344 A1* | 3/2016 | Agam | H01L 29/063 257/493 |
| 2016/0372483 A1* | 12/2016 | Cho | H01L 27/1203 |

\* cited by examiner

*Primary Examiner* — Brian Turner
(74) *Attorney, Agent, or Firm* — NSIP Law

(57) ABSTRACT

An integrated semiconductor device includes a first transistor and a second transistor formed on a semiconductor substrate, and an isolation structure located adjacent to the transistors, including deep trenches, trapping regions formed between the deep trenches, and trench bottom doping regions formed at the end of each of the deep trenches, wherein each of the trapping regions includes a buried layer, a well region formed on the buried layer, and a highly doped region formed on the well region.

15 Claims, 15 Drawing Sheets

600

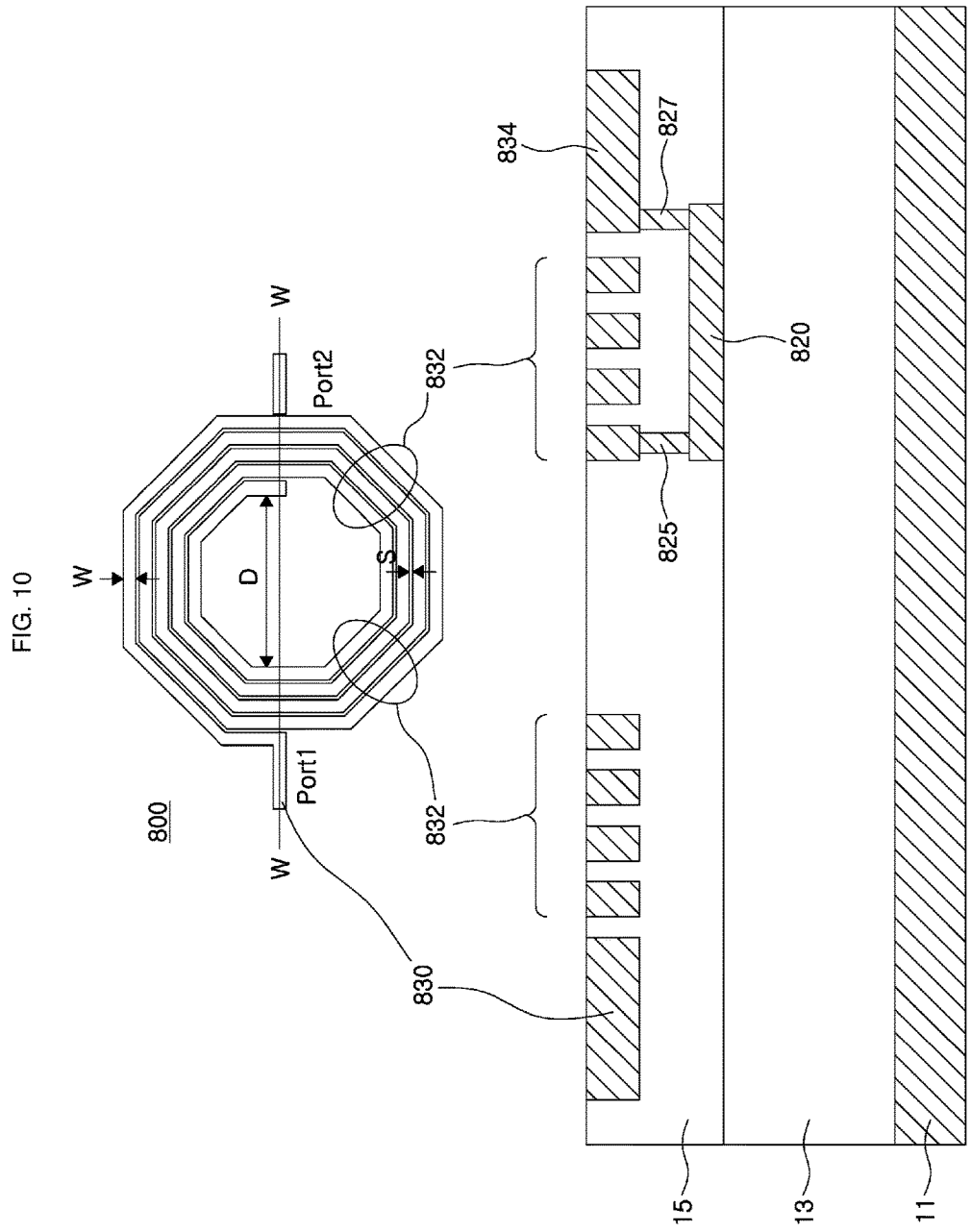

INTEGRATED SEMICONDUCTOR DEVICE HAVING ISOLATION STRUCTURE FOR REDUCING NOISE

CROSS-REFERENCE TO RELATED APPLICATIONS

This application claims the benefit under 35 USC 119(a) of Korean Patent Application No. 10-2016-0178432 filed on Dec. 23, 2016 in the Korean Intellectual Property Office, the entire disclosure of which is incorporated herein by reference for all purposes.

BACKGROUND

1. Field

The following description relates to an integrated semiconductor device. The following description also relates to an integrated semiconductor device in which a Radio Frequency (RF) Complementary Metal-Oxide Semiconductor (CMOS) transistor and a Hall sensor having an isolation structure for noise reduction are formed on a single semiconductor substrate.

2. Description of Related Art

Recently, expectations for Internet-of-Things (IoT) that connect cars, wearable electronic devices, building automatic equipment, and various other applied products are dramatically increasing. The chips needed for IoT include components such as a low-power battery, a microcontroller unit (MCU), an RF CMOS transistor and sensors.

In general, an enormous cost is incurred in the process of manufacturing a number of integrated semiconductor devices on a single semiconductor substrate simultaneously. This cost is incurred because dozens of masks are input whenever each device is manufactured, and accordingly, dozens of photolithography processes and etching processes accompany the manufacturing process. As these processes are repeated, the production cost increases. To manufacture a cheaper integrated semiconductor device or chip, an object is to reduce a number of mask steps. Thus, a lower cost manufacturing process is possible by such a reduction. Such a reduction corresponds to using bipolar-CMOS-Double-Diffused Metal-Oxide-Semiconductor (DMOS) (BCD) technology among the processes of manufacturing a number of integrated semiconductor devices on a single semiconductor substrate.

However, as the manufacturing processes of a low power battery needed for providing an IoT device with components such as the MCU, the RF CMOS transistor, and the sensors discussed above do not correspond to each other, integrated manufacturing with a low-cost solution is difficult to achieve.

Transistors interactively exchange influence when they are manufactured on a single semiconductor substrate at a time. This influence appears in a form of noise, and RF CMOS transistors and Hall sensors are very sensitive to such noise. Separation from surrounding devices is used to reduce noise, and a junction guard ring structure has been used in alternative approaches. However, the junction guard ring structure has an issue of making chip size increase.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an integrated semiconductor device includes a first transistor and a second transistor sensitive to noise formed on a semiconductor substrate, and an isolation structure located adjacent to the transistors, including deep trenches, trapping regions formed between the deep trenches, and trench bottom doping regions formed on the end of each of the deep trenches, wherein each of the trapping regions includes a buried layer, a well region formed on the buried layer, and a highly doped region formed on the well region.

The deep trenches may include a first trench, a second trench, a third trench, and a fourth trench formed spaced apart from each other, the trapping regions may include a first trapping region formed between the first trench and the second trench, a second trapping region formed between the second trench and the third trench, and a third trapping region formed between the third trench and the fourth trench, and the first trapping region and the third trapping region may have a same depth.

The second trapping region may include a well region of a second conductivity type, and a highly doped region of a second conductivity type formed on the well region.

A trench bottom doping region may contact two trenches.

The first transistor may include either one or both of a Radio Frequency (RF) Complementary Metal-Oxide-Semiconductor (CMOS) transistor and a Hall sensor.

The RF CMOS transistor may include a buried layer of a first conductivity type formed on the semiconductor substrate, a first well region of a second conductivity type and a second well region of the first conductivity type formed on the buried layer, a first RF MOSFET formed on the first well region, and a second RF MOSFET formed on the second well region.

The buried layer of the RF CMOS transistor may directly contact one of the deep trenches.

The sensing region may directly contact one of the deep trenches.

The Hall sensor may include a sensing region of a first conductivity type formed on the substrate, highly doped regions of the first conductivity type formed on the sensing region and located apart from each other, a highly doped upper region of a second conductivity type formed between the highly doped regions, and device isolation layers formed between each highly doped region and a corresponding highly doped upper region.

The second transistor may include a Laterally Diffused Metal-Oxide Semiconductor (LDMOS) transistor or a non-volatile memory device.

The LDMOS transistor may include a first drift region of a first conductivity type formed on the substrate, a body region of a second conductivity type, a source region formed in the body region, and a first drain region formed in the first drift region.

Each of the deep trenches may include a deep trench portion and a shallow trench portion formed overlapping with the deep trench portion.

In another general aspect, an integrated semiconductor device includes a transistor formed on a semiconductor substrate, an isolation structure surrounding the transistor, wherein the isolation structure includes trenches including a first trench and a second trench formed apart from each other, a first trapping region of a first conductivity type formed between the first and second trenches, a second trapping region of a second conductivity type formed on a part of the first trench, a third trapping region of the second conductivity type formed on a part of the second trench, and a trench bottom doping region of the second conductivity type formed on an end of the trenches.

The first trapping region may include a highly doped deep doping region, a well region formed on the buried layer, and a buried layer, wherein a well region is formed on the buried layer, and wherein a highly doped doping region is formed on the well region.

The second and third trapping regions may respectively include a well region, and a highly doped doping region formed on the well region.

The transistor may include a Hall sensor, wherein the Hall sensor includes a sensing region formed on the substrate, highly doped regions of a first conductivity type formed on the sensing region and located apart from each other, a highly doped upper region of the second conductivity type formed between the highly doped regions, and device isolation layers formed between each highly doped region and the doping region.

Other features and aspects will be apparent from the following detailed description, the drawings, and the claims.

BRIEF DESCRIPTION OF THE DRAWINGS

FIG. 10 is a cross-sectional view of an inductor structure included in an integrated semiconductor device according to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
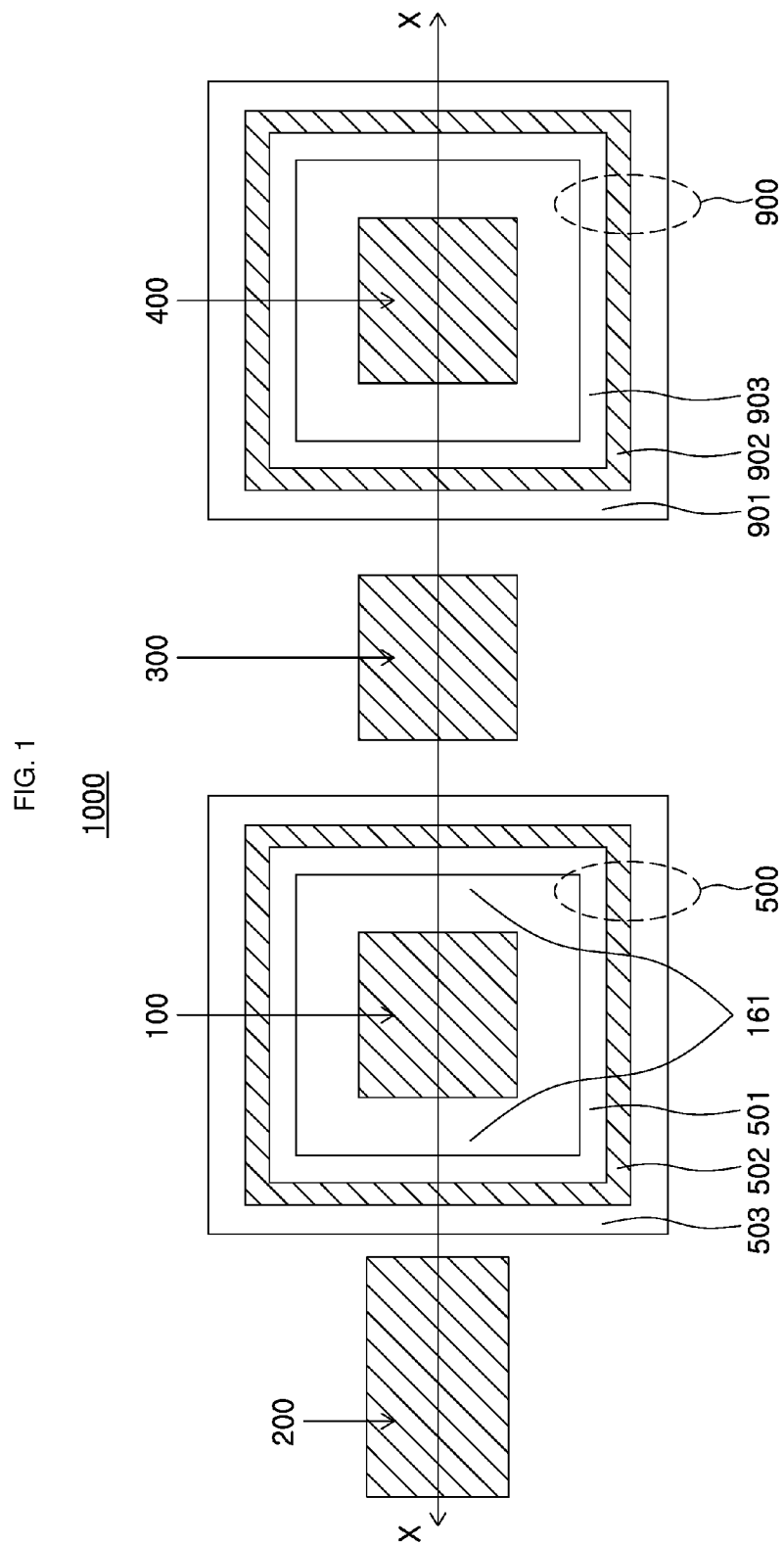
FIG. 1 is a top plan view of an integrated semiconductor device with an isolation structure for reducing noise according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure.

The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

The examples are directed to providing an integrated semiconductor device having an isolation structure designed to block the noise that flows into an RF CMOS transistor and a Hall sensor.

Thus, the examples are directed to providing an integrated semiconductor device including an RF CMOS transistor and a Hall sensor with excellent noise insulation.

Also, examples manufacture an integrated semiconductor device in which an RF CMOS transistor and a Hall sensor operate well through using an isolation structure that obstructs noise well.

The examples easily provide an integrated semiconductor device in which an RF CMOS transistor, a Hall sensor, an n-type Laterally Diffused Metal-Oxide Semiconductor (nLDMOS) transistor, Electrically Erasable Programmable Read-Only Memory (EEPROM), a varactor, or an inductor are formed on a single semiconductor substrate at a low cost.

FIG. 1 is a top plan view of an integrated semiconductor device 1000 with an isolation structure for reducing noise according to an example.

Figure 2:
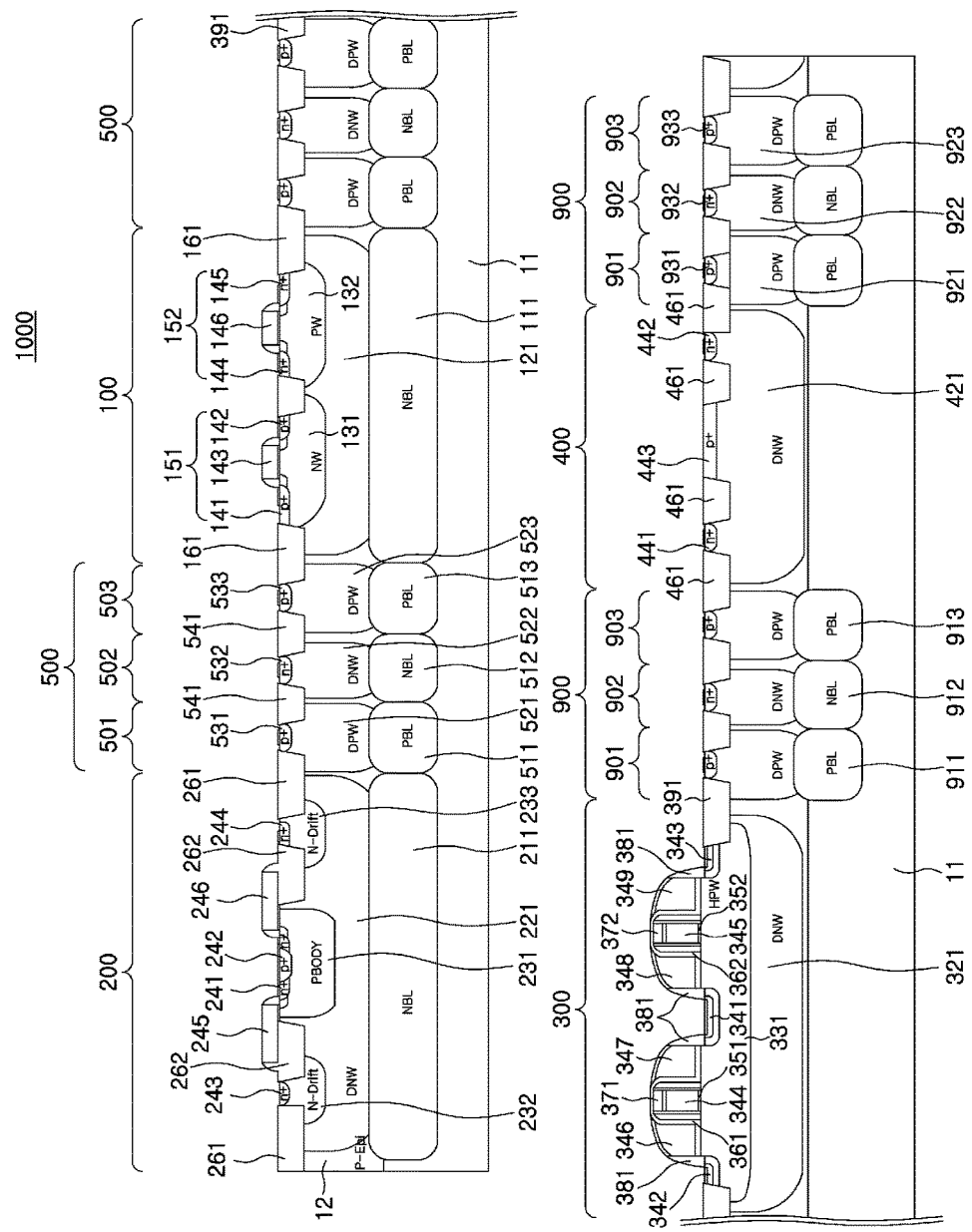
FIG. 2 is a cross-sectional view of an integrated semiconductor device with an isolation structure for reducing noise according to an example.

Accordingly, FIG. 2 is a cross-sectional view illustrating each main device integrated by a single process of an integrated semiconductor device 1000 with an isolation structure for reducing noise.

As illustrated in the example of FIG. 1, an integrated semiconductor device 1000 according to the first example includes at least one or more transistors 100, 200, 300, 400. For example, as these transistors, an RF CMOS transistor 100, a BCD semiconductor 200, a non-volatile memory device 300, a Hall sensor 400, and so on, are arranged. In such an example, the BCD semiconductor 200 may be a DMOS, an LDMOS, or an EDMOS transistor 200. The non-volatile memory device 300 may be an Electrically Erasable Programmable Read-Only Memory (EEPROM) transistor 300. To minimize the interference from other integrated semiconductor devices with respect to an RF CMOS transistor 100, a first junction guard ring structure as an isolation structure 500 is formed. The first junction guard ring structure 500 includes a first guard ring 501, a second guard ring 502, and a third guard ring 503, and is formed to surround the RF CMOS transistor 100. Likewise, to minimize the interference from other transistors with respect to a Hall sensor 400, a second junction guard ring structure 900 is formed. The second junction guard ring structure 900 includes a fourth guard ring 901, a fifth guard ring 902, a sixth guard ring 903, and is formed to surround the Hall sensor 400. By forming the guard ring structure, it is possible to minimize the effects of a transistor as it operates with respect to surrounding transistors and to occlude noise from surrounding transistors. In particular, as the RF CMOS transistor 100 and the Hall sensor 400 are very sensitive to noise, it is helpful to form a guard ring structure as described.

FIG. 2 is a cross-sectional view of an integrated semiconductor device with an isolation structure for reducing noise according to an example.

In particular, FIG. 2 is a cross-sectional view of cutting FIG. 1 in an X-X direction. An integrated semiconductor device 1000 according to an example includes a first junction guard ring structure 500 and a second junction guard ring structure 900. First, an integrated semiconductor device 1000 includes an epi-layer P-EPI 12 of a second conductivity type on an N-type or P-type substrate 11. Also, a plurality of deep doping layers of a first conductivity type NBL 111, 211, 512, 912 and a plurality of deep doping layers of a second conductivity type PBL 511, 513, 911, 913 are formed between the epi-layer 12 and the substrate 11. Additionally, at least one or more transistors such as an RF CMOS transistor 100, a BCD semiconductor 200, an EEPROM transistor 300, and a Hall sensor 400, and so on, are formed integrated onto the substrate 11.

As illustrated in the example of FIG. 2, a first junction guard ring structure 500 includes a first guard ring 501, a second guard ring 501, and a third guard ring 503. The first guard ring 501 includes a first deep doping layer PBL 511, a first deep well region DPW 521, and a first highly doped doping P+ region 531, all of which have a second conductivity type. In an example, the second conductivity type is a P-type and the first conductivity type is an N-type. However, the opposite is also possible. In the example of FIG. 2, PBL 511 is formed within the substrate 11. The DPW 521 is formed on the PBL 511. The P+ region 531 is formed on the first deep well region 521.

The second guard ring 502 includes a second deep doping layer NBL 512, a second deep well DNW 522 and a second highly doped doping N+ region 532, all of which have a second conductivity type, as discussed above. In such an example, the NBL 512 is formed on the substrate 11. The DNW 522 is formed on the NBL 512. The N+ region 532 is formed on the DNW region 522.

The third guard ring 503 includes a third deep doping layer PBL 513, a third deep well region DPW 523 and a third highly doped region P+ 533, all of which have a second conductivity type, as discussed above. In such an example, the third guard ring 503 is formed apart from the first guard ring 501 by the second guard ring 502, and has the same structure as the first guard ring 501. The PBL 513 is formed on the substrate 11. The DPW region 523 is formed on the PBL 513. The P+ region 533 is formed on the DPW region 523.

A ground voltage is supplied to all of the first, the second, and the third guard rings 501, 502, 503, and the first, the second, and the third guard rings 501, 502, 503 are arranged to entirely surround the RF CMOS transistor 100. An isolation structure 541 is formed between the first, the second, and the third guard rings 501, 502, 503.

The second junction guard ring structure 900 surrounding the Hall sensor 400 includes a first guard ring 901, a second guard ring 902, and a third guard ring 903. The second junction guard ring structure is similar to the first junction guard ring structure 500. The first and the third guard rings 901, 903 include the PBL 911, 913, DPW 921, 923, and P+ regions of the second conductivity type 931, 933. The second guard ring 902 includes the NBL 912, DNW 922, N+ 932 regions of the first conductivity type. Drifting hole carriers escape through the first or the third guard rings 901, 903, and electron carriers escape through the second guard ring 902. Therefore, it is possible to preclude the influence of noise generated around the Hall sensor 400.

Subsequently, electrical operations of each component of the integrated semiconductor device 1000 in FIG. 2 are explained in further detail.

The RF CMOS transistor 100 includes a deep doping layer 111 of a first conductivity type, a deep well region 121 of a second conductivity type, a first well region 131, a second well region 132, a first RF MOSFET 151 and a second RF MOSFET 152. The first RF MOSFET 151 and the second RF MOSFET 152 respectively include a first and a second corresponding instance of drains, gates, and source regions 141 to 146. A deep doping layer 111 of a first conductivity type is formed on the RF CMOS transistor 100 to preclude the influence of noise from the substrate 11. To form a channel region, a first well region 131 of a first conductivity type and a second well region 132 of a second conductivity type on the deep doping layer 111 of a first conductivity type are formed. Also, a first RF MOSFET 151 is formed on a first well region 131, and a second RF MOSFET 152 is formed on a second well region 132. A device isolation layer 161 is formed between the RF CMOS transistor 100 and the first guard ring structure 500. This formation of the device isolation layer 161 is because the first and the second source regions and drain regions 141, 142, 144, 145 of the RF CMOS transistor 100 are to be formed apart from the highly doped regions 531 to 533 of the first junction guard ring structure 500.

In the example of FIG. 2, the DMOS transistor 200 is formed on the substrate 11 and is formed to be separated from the RF CMOS transistor 100 by the first junction guard ring structure 500. An LDMOS transistor, which is an example of the DMOS transistor 200, includes a deep doping layer of a first conductivity type NBL 211, a deep well region of a first conductivity type DNW 221, a body region of a second conductivity type P-body 231, a drift region of a first conductivity type N-Drift 232, 233, a third and a fourth source region 241 and drain regions 243, 244 of a first conductivity type, a pick-up region of a second conductivity type 242, and a third and a fourth gate electrode 245, 246. The deep doping layer 211 of a first conductivity type is formed between the substrate 11 and the epi-layer 12. The deep well region 223 is formed on the epitaxial layer 12. The body region 231 and the drift regions 232, 233 are formed within the deep well region 221. The third and the fourth source regions of highly doped 241 and the body contact region 242 are all formed on the body region 231. The third and the fourth drain regions 243, 244 are formed on the drift regions 232, 233. In this example, the third and the fourth drain regions 243, 244 are arranged on both sides with the third and the fourth source region 241 and the pick-up region 242 in their center. A device isolation layer 261 is formed between the LDMOS transistor 200 and the first junction guard ring structure 500.

A non-volatile memory device 300 includes a high voltage well region HPW 331 of a second conductivity type, such as P, on the deep well region DNW 321 of a first conductivity type, such as N, drain regions 342, 343 of a first conductivity type, such as N, and a source region 341, floating gates 344, 345 and control gates 346 to 349. The drain regions 342, 343 and the source region 341 are formed on the high-voltage well region HPW 331. The floating gates 344, 345 are formed between the drain regions 342, 343 and the source region 341. The control gates 346 to 349 are formed to be self-aligned on both sides of the floating gates 344, 345. Also, in the example of FIG. 2, a non-volatile memory device 300 further includes tunnel insulation films 351, 352, dielectric films 361, 362, hard masks 371, 372 and a spacer 381. The tunnel insulation films 351, 352 are formed below the floating gates 344, 345. The dielectric films 361, 362 are formed between the floating gates 344, 345 and the control gates 346 to 349, and the dielectric films 361, 362 may have oxide film-nitride film-oxide film (ONO) structures. The hard masks 371, 372 are formed on the floating gates 344, 345. The spacer 381 is formed on the side of the control gates 346 to 349. Programming and erasure of the non-volatile memory cell are all performed by a method of non-volatile programming and erasure, such as Fowler-Nordheim Tunneling. The device isolation film 391 is formed between the non-volatile memory device 300 and the first junction 500.

In the example of FIG. 2, the Hall sensor 400 includes a sensing region 421, a first and a second highly doped region 441, 442, a highly doped region 443, a third and a fourth highly doped region, and a plurality of device isolation films 461. The sensing region of a first conductivity type DNW 421 is formed on the substrate 11. To reduce the surface noise on the upper part of the sensing region of a first conductivity type DNW 421, a highly doped region of a second conductivity type 443 is formed on the upper part of the sensing region. The first and the second highly doped regions of a first conductivity type N+ 441, 442 are formed on the sensing region DNW 421 and are arranged apart from each other. The first and the second highly doped regions of a first conductivity type N+ 441, 442 are formed on both sides of the sensing region DNW 421 and operate based on current, voltage input, or output node. The third and the fourth highly doped regions of a second conductivity type, such as P+, are formed within the well region of a second conductivity type PW 422 to supply voltage to the substrate 11. The plurality of device isolation films 461 are formed among a first highly doped region 441, a second highly doped region 442, and a third and a fourth contact regions.

As illustrated in the example of FIG. 2, it is possible to easily provide an integrated semiconductor device in which an nLDMOS 200, an RF CMOS transistor 100, an EEPROM transistor 300, and a Hall sensor 400 are formed on a single semiconductor substrate. This approach is possible because it is possible to form NBL, PBL, DNW, DPW, N+, P+ regions used for a junction guard ring structure at the same time when a transistor is formed. Accordingly, it is possible to reduce the number of masks used to manufacture such an integrated semiconductor device.

Figure 3:
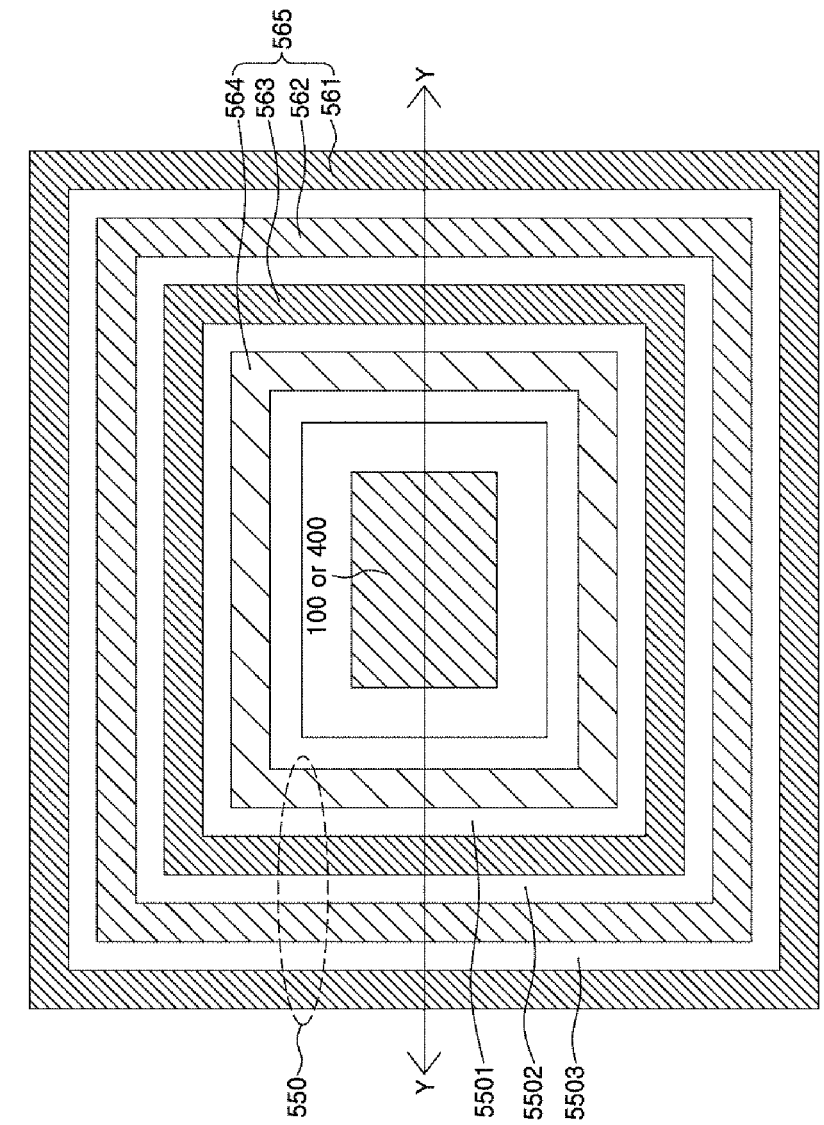
FIG. 3 is a top plan view of an integrated semiconductor device with an isolation structure for reducing noise according to an example.

FIG. 3 is a top plan view of an integrated semiconductor device 1000 with an isolation structure for reducing noise according to an example.

As illustrated in the example of FIG. 3, an integrated semiconductor device 1000 includes an isolation structure 550 that surrounds an RF CMOS transistor 100 or a transistor 100 or 400, such as a Hall sensor 400. The isolation structure 550 includes a plurality of deep trench structures 565. The isolation structure 550 is a structure formed by transforming the junction guard ring structure of the example of FIG. 2 to a plurality of deep trench structures 565. The width of the deep trench structure 565 may be smaller compared to the junction guard ring structure of FIG. 2. This smaller width is possible because the width of each deep trench 561 to 564 may be made to be smaller than the width of the junction guard ring. Instead, the depth of each deep trench 561 to 564 may be deeper than the depth of the junction. For the examples of a transistor 100 or 400 of FIG. 3, there is an RF CMOS transistor 100 or a Hall sensor 400, as discussed above. As illustrated in the example of FIG. 3, the isolation structure is a symmetric one. The isolation structure also has a symmetric structure in its upper and lower parts.

Figure 4:
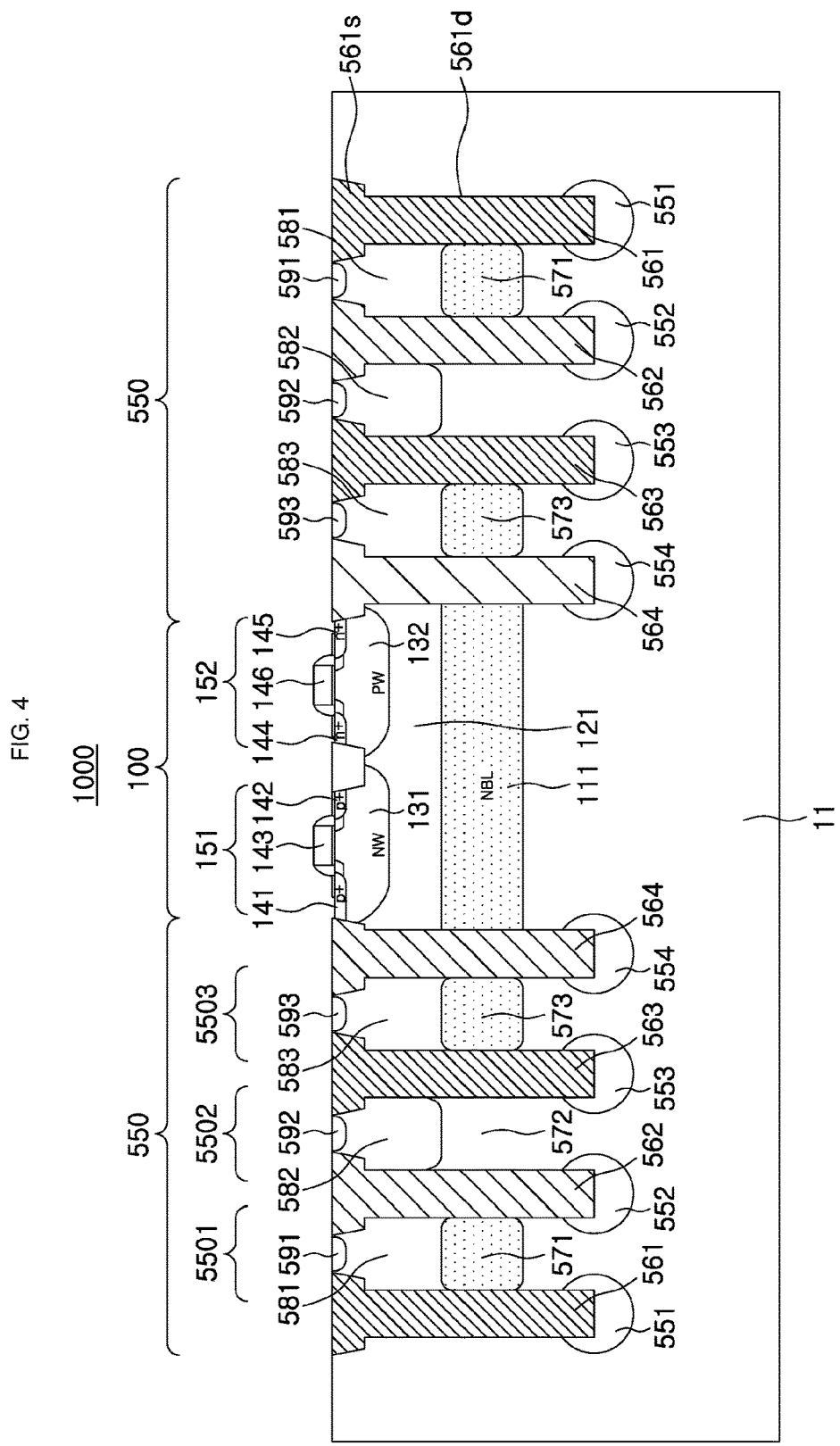
FIG. 4 is a cross-sectional view of an integrated semiconductor device with an isolation structure for reducing noise according to an example.
Figure 5:
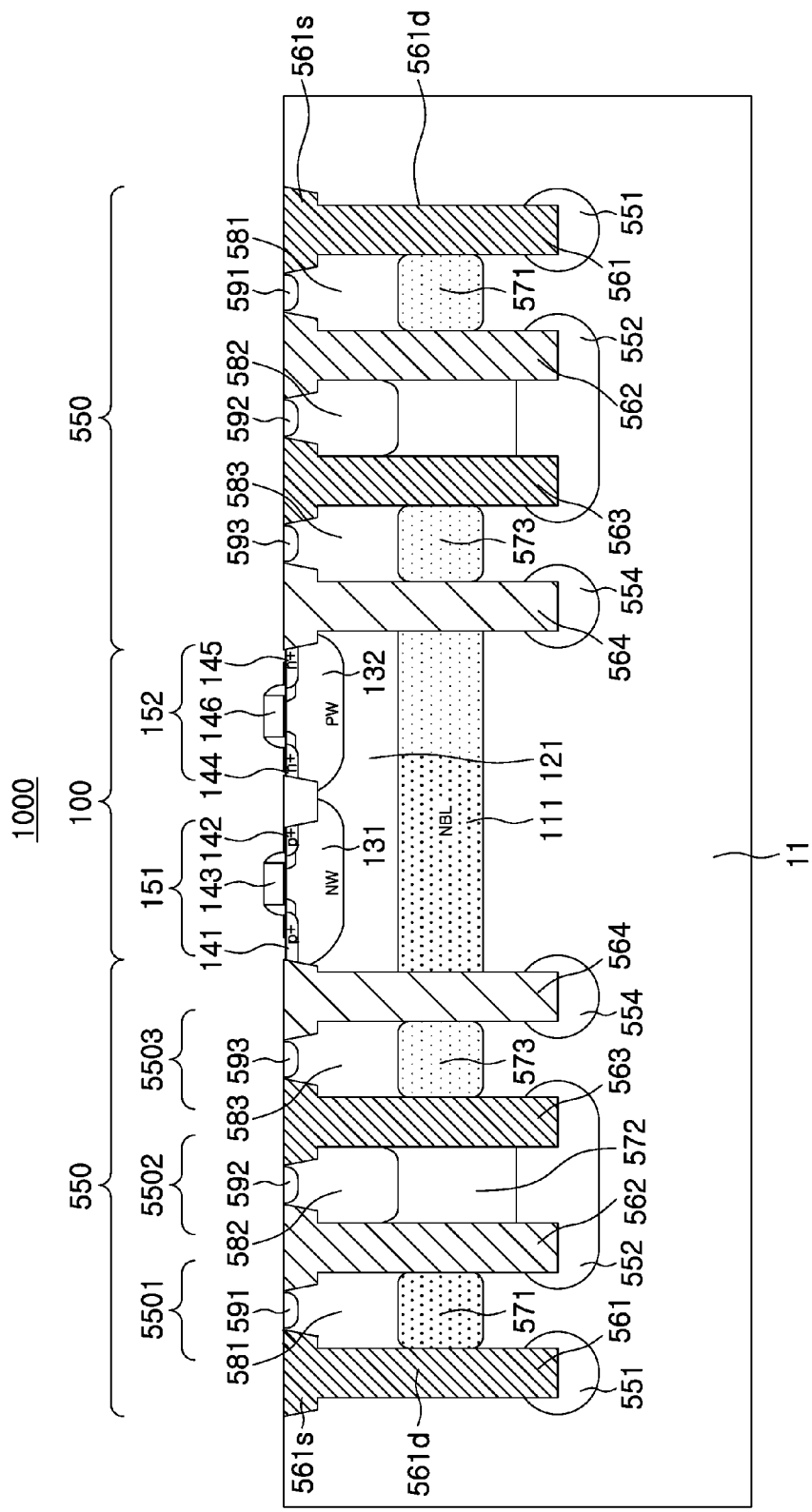
FIG. 5 is a cross-sectional view of an integrated semiconductor device with an isolation structure for reducing noise according to an example.
Figure 6:
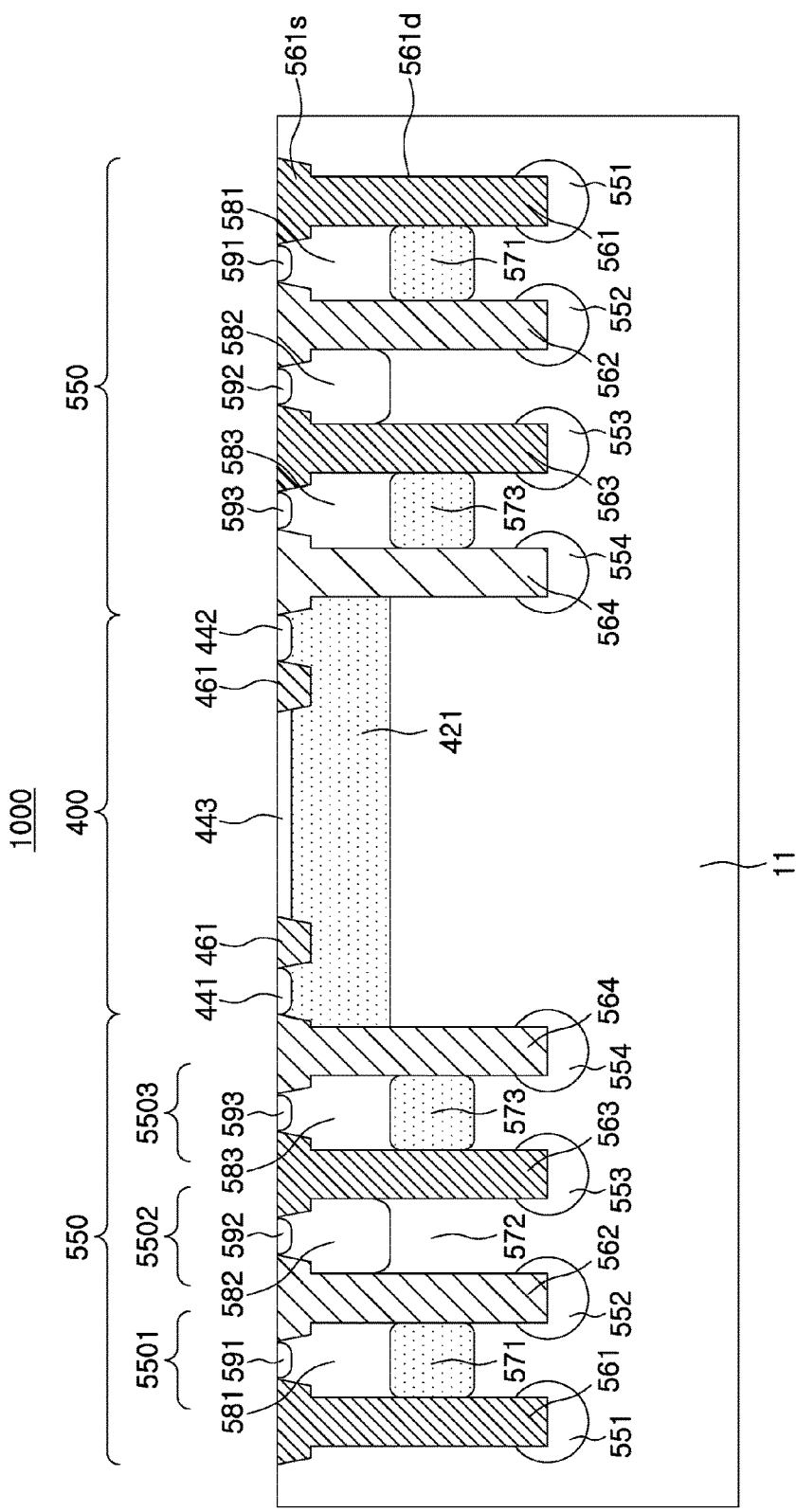
FIG. 6 is a cross-sectional view of an integrated semiconductor device with an isolation structure for reducing noise according to an example.

FIG. 4, FIG. 5 and FIG. 6 are cross-sectional views taken along the Y-Y line of FIG. 3 and illustrate cross-sectional views of an integrated semiconductor device with an isolation structure for reducing noise.

As illustrated in the example of FIG. 4, an integrated semiconductor device includes an isolation structure 550 of a deep trench type that surrounds a transistor 100. In the example of FIG. 4, an RF CMOS transistor is an example of a transistor 100. The isolation structure 550 of a deep trench type including a plurality of deep trenches 565 including a first, a second, a third, and a fourth deep trench 561, 562, 563, 564 that are formed apart from each other. The isolation structure 550 also includes a first trapping region 5501, a second trapping region 5502 and a third trapping region 5503. The first trapping region 5501 is formed between a first deep trench 561 and a second deep trench 562. A second trapping region 5502 is formed between a second deep trench 562 and a third deep trench 563. A third trapping region 5503 is formed between a third deep trench 563 and a fourth deep trench 564.

Each of the first and the third trapping regions 5501, 5503 includes a respective N-type buried layer NBL 571, 573, a respective N-type deep well region DNW 581, 583 formed in the buried layer, and respective N-type highly doped regions N+ 591, 593 formed on the deep well regions 581, 583. The second trapping region 5502 includes a P-type deep well region DPW 582 and a P-type highly doped region P+ 592 formed on the deep well region 582. A bottom surface of the NBLs 571, 573 in the first/third trapping region 5501, 5502 is formed below the DPW 582 in the second trapping region 5502. In the second trapping region 5502, there is no P-type buried layer PBL, because the P-type semiconductor region 572 exists under the DPW 582. However, to reduce resistance, it is possible to additionally form a P-type highly doped region 572 such as a P-SINK region or a PBL under the DPW 582.

In the example of FIG. 4, trench bottom doping regions 551 to 554 are formed at the end of each of deep trenches 561-564. The trench bottom doping region 551 has a P-type conductivity type to capture noise components such as hole or electron carriers. Additionally, trench bottom doping region 551 lowers the electric field around the trench bottom portion of the deep trench 561.

Each of the trench bottom doping regions 551 to 554 contacts each bottom surface of the deep trenches 561 to 564. Each of the trench bottom doping regions 551 to 554 covers an end surface of each bottom surface of the deep trenches 551 to 554.

FIG. 5 is a cross-sectional view of an integrated semiconductor device with an isolation structure for reducing noise according to an example.

As illustrated in the example of FIG. 5, an integrated semiconductor device 1000 includes an isolation structure 550 of a trench-type encompassing a transistor 100 structure. In the example of FIG. 5, the isolation structure 550 includes a plurality of trenches 565 including a first, a second, a third, and a fourth trench 561, 562, 563, 564 that are formed apart from each other. A difference between FIG. 5 and FIG. 4 lies in the structure of the trench bottom doping regions 551, 552, 554 formed at the end of the trench. The trench bottom doping region 552 contacts each bottom surface of the two deep trenches 562, 563 and covers an end surface of each of the bottom surface of the two deep trenches 562, 563. In the example of FIG. 5, a trench bottom doping region 552 is formed at the end of the at least two trenches 562, 563, and the trench bottom doping region 552 is laterally extended with respect to the at least two trenches 562, 563. Therefore, a width of the trench bottom doping region 552 is greater than that of each of the other trench bottom doping regions 551, 554. In this manner, noise caused by hole carriers may be more efficiently blocked, as the trench bottom doping region 552 is laterally extended in a way that facilitates blocking such noise.

The explanations about the rest of the numbers of elements of FIG. 5 are identical to the explanation of corresponding elements of FIG. 4. The trench bottom doping region 552 and the DPW 582 in the second trapping region 5502 are connected to each other by the P-type semiconductor region 572. However, to reduce resistance, it is possible to arrange a P-type highly doped region 572, such as a P-SINK region or PBL, between the trench bottom doping region 552 and the DPW 582.

FIG. 6 is a cross-sectional view of an integrated semiconductor device with an isolation structure for reducing noise.

As illustrated in the example of FIG. 6, an integrated semiconductor device includes an isolation structure 550 of a trench-type surrounding a Hall sensor 400. The Hall sensor structure 400 is identical to corresponding elements of the above explanation. The isolation structure 550 is also similar to the corresponding elements of the above explained structure. However, in the example of FIG. 6, a magnetic sensing region 421 is highly sensitive to noise. When the electrons or hole carriers drifting around the Hall sensor 400 are about to enter the sensing region 421, the electrons or hole carriers are entrapped by the plurality of trapping regions 5501, 5502, 5503 located between each trench structure. It is possible to block noise-causing elements taken into the Hall sensor 400 by using an isolation structure 550 of a trench-type.

In the example of FIG. 6, each of a first N-type highly doped region 441 and a second N-type highly doped region 442, disposed in the sensing region 421, directly contact one of trench structures 561 to 564. The first highly doped region 441 and the second highly doped region 442 are used for applying a bias voltage to the sensing region 421 to measure magnetic current. The sensing region 421 also directly contacts one of trench structures 561 to 564. The trench structures 561 to 564 fully enclose all the side surface of the sensing region 421. In this way, noise may be much reduced.

As illustrated in the examples of FIGS. 4 to 6, in particular FIG. 5, each trench structure 561 to 564 is formed by combining a deep trench region 561d and a shallow trench region 561s, and the shallow trench region 561s is usually located on the surface of the substrate. The depth of the deep trench 561d may be manufactured differently according to the features of devices and the depth of the deep trench 561d may be formed to be from 5 to 20 µm. The depth of the shallow trench 561s may be formed to be from 0.3 to 5 µm. The shallow trench structure 561s is formed to overlap with the deep trench structure 561d. In other examples, is also possible to use a Local Oxidation of Silicon (LOCOS) structure, instead of the shallow trench structure 561s. Also, a bottom surface of the deep trench region 561d has an option between having a closed shape and an open shape.

The trench structure 561 includes a first material of liner film on the side wall of the trench 561 and a second material of conductive material in the middle. For a conductive material, poly-silicone is an example, but other appropriate conductive materials are used in other examples. In an example, when it is filled with thick insulator films and conductive materials such as poly-silicones, the bottom portion of the trench 561 is opened so as to be electrically connected to the substrate. In this manner, holes or electrons drifting below can be entrapped through using the trench structure 561. In this example, the top portion of the trench is to be electrically connected to the poly-silicone by a tungsten plug, for example, or another appropriate electrical connector. For example, if the a tungsten plug is used, thereby, entrapped electrons or hole carriers can escape upwards through the tungsten plug. Alternatively, it is also possible to fill the trench structure 561 with only thick insulating material.

As illustrated in the examples of FIG. 4 and FIG. 5, the structure of an RF CMOS transistor 100 is completely surrounded by the NBL 111 region with respect to areas down below and laterally, by the trench structures 561, 562, 563, 564. Therefore, noise elements flowing around the RF CMOS transistor 100 are thoroughly blocked. For example, the NBL 111 region is in contact with the trench structure 564 on both sides. By using such an approach, a complete isolation structure to comprehensively block noise is formed.

Figure 7:
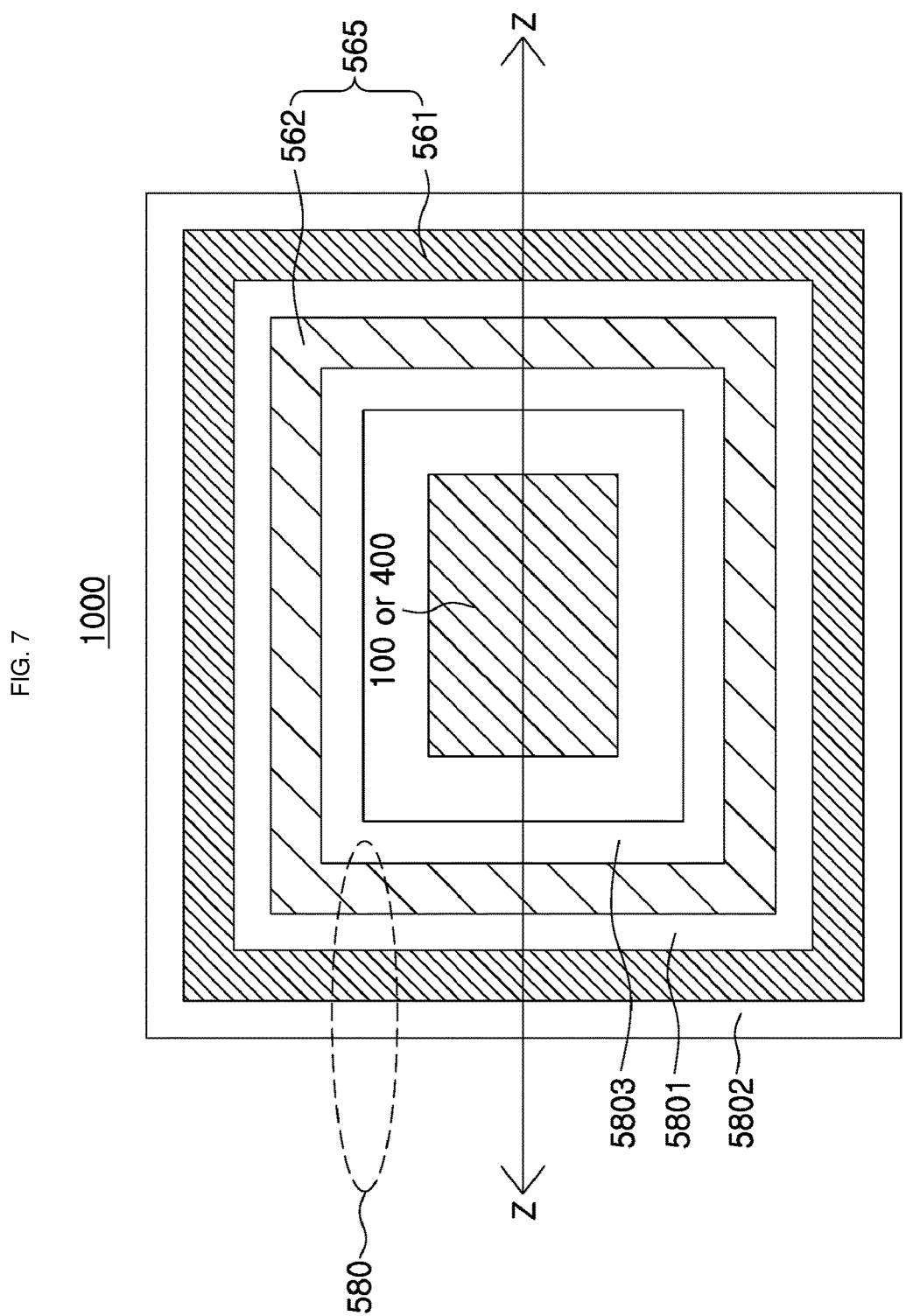
FIG. 7 is a top plan view of an integrated semiconductor device with an isolation structure for reducing noise according to an example.

FIG. 7 is a top plan view of an integrated semiconductor device with an isolation structure for reducing noise according to an example.

As illustrated in the example of FIG. 7, an integrated semiconductor device 1000 includes at least one or more transistors 400 and includes an isolation structure 580 formed by a plurality of trench structures 565 surrounding the transistor 400. A plurality of trench structures 565 includes at least two trenches 561, 562. In the example of FIG. 7, a Hall sensor 400 can be an example of a transistor.

Figure 8:
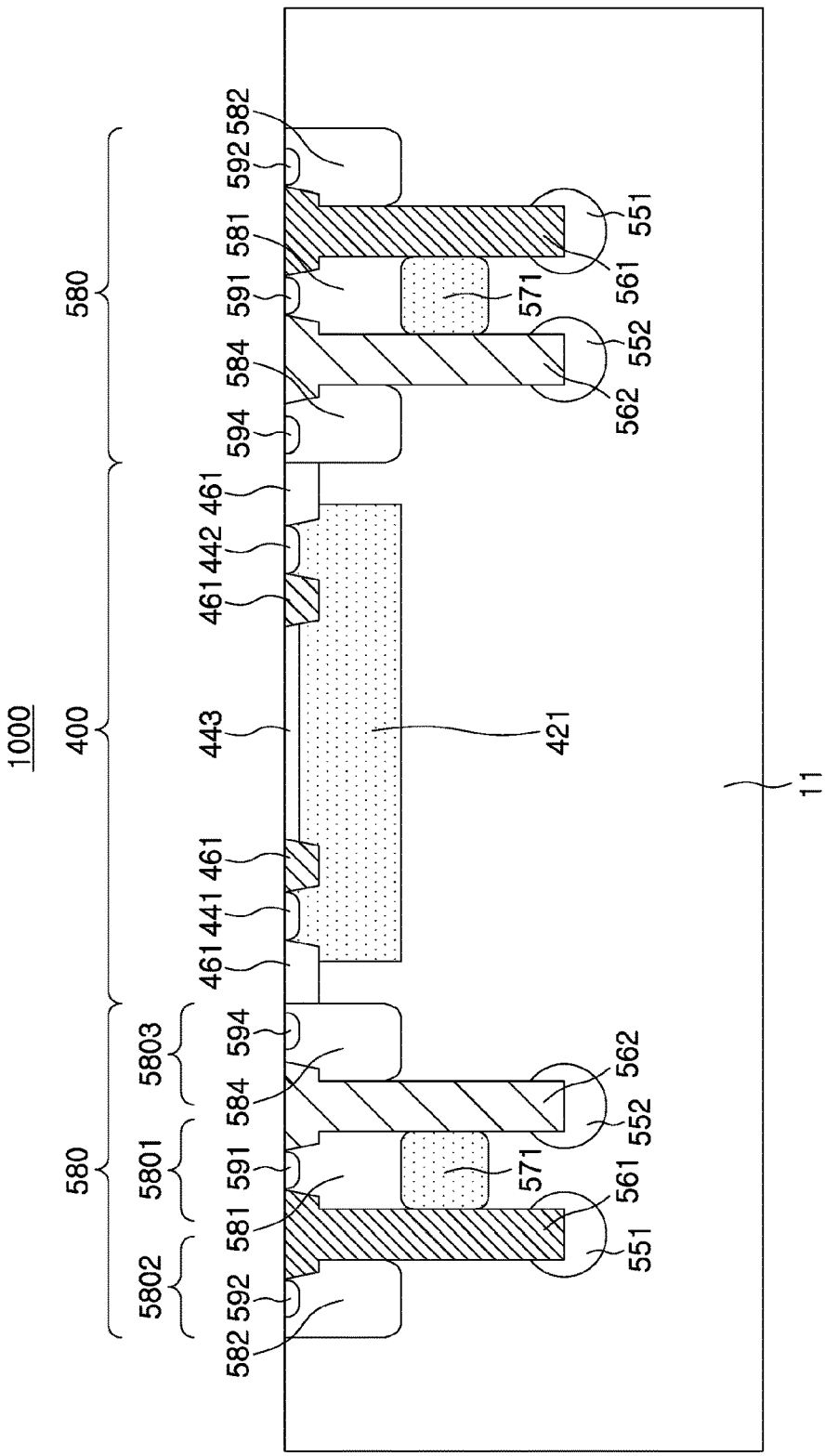
FIG. 8 is a cross-sectional view of an integrated semiconductor device with an isolation structure for reducing noise according to an example.

FIG. 8 is a cross-sectional view of an integrated semiconductor device with an isolation structure for reducing noise according to an example.

FIG. 8 is a cross-sectional view taken along a Z-Z- line of FIG. 7. As illustrated in the example of FIG. 8, an integrated semiconductor device 1000 includes at least one or more transistors 400 formed on the semiconductor substrate and an isolation structure 580 surrounding a transistor 400. The isolation structure 580 includes a plurality of trenches 565 including a first and a second trenches 561, 562 formed apart from each other, a first trapping region 5801 of a first conductivity type formed between a first and a second trench 561, 562, a second trapping region of a second conductivity type 5802 formed at the end of the first trench 561, a third trapping region of a second conductivity type 5803 formed at the end of the second trench 562, and trench bottom doping regions of a second conductivity type 551, 552 formed at the end of the at least one trench. Each of the trench bottom doping regions 551, 552 also contacts each bottom surface of the two deep trenches 561, 562 and covers an end surface of each of the bottom surface of the two deep trenches 561, 562.

In the example of FIG. 8, a sensing region 421 is sensitive to noise, and in response to the electrons or hole carriers drifting around the sensor being about to enter the sensing region, the electrons or hole carriers are entrapped by a plurality of doping regions 5801, 5802, 5803 formed between each trench structure. Thus, it is possible to block noise elements flowing into the Hall sensor by using an isolation structure 580 of a trench-type. The structure of FIG. 8 has an advantage of reducing the region size of a chip as it has fewer trenches compared to the structure of FIG. 6. Also, each shallow trench region 461 in the example of FIG. 8 is formed between the first and the second highly doped regions 441, 442 and the second deep trench 562 of the isolation structure. Accordingly, using the FIG. 8 causes it to be possible to effectively block noise elements.

For example, the first trapping region 5801 includes a buried layer 571, an N-type deep well region DNW 581 formed on the N-type buried layer 571, and a N-type highly doped region N+ 591 formed on the N-type deep well region 581. The second and the third trapping regions 5802, 5803 respectively comprise P-type deep well regions DPW 582, 584 and P-type highly doped regions P+ 592, 594 formed on the deep well regions DPW 582, 584. For example, the second P-type deep well region 584 contacts both shallow trench isolation 461 and deep trench 562 regions.

Figure 9A:
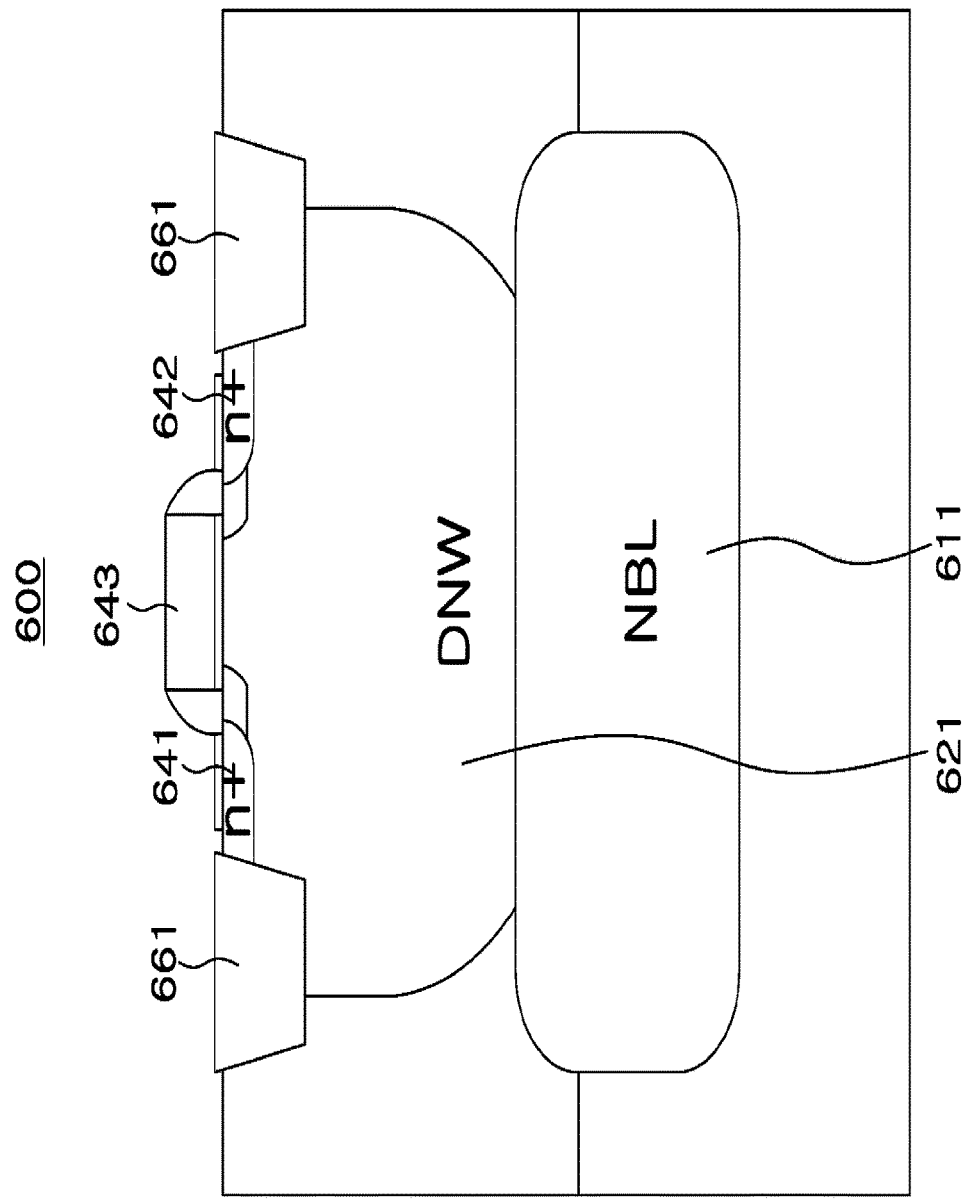
FIGS. 9A and 9B are, respectively, a cross-sectional view of a varactor and a poly resistor included in an integrated semiconductor device 1000 according to an example.
Figure 9B:
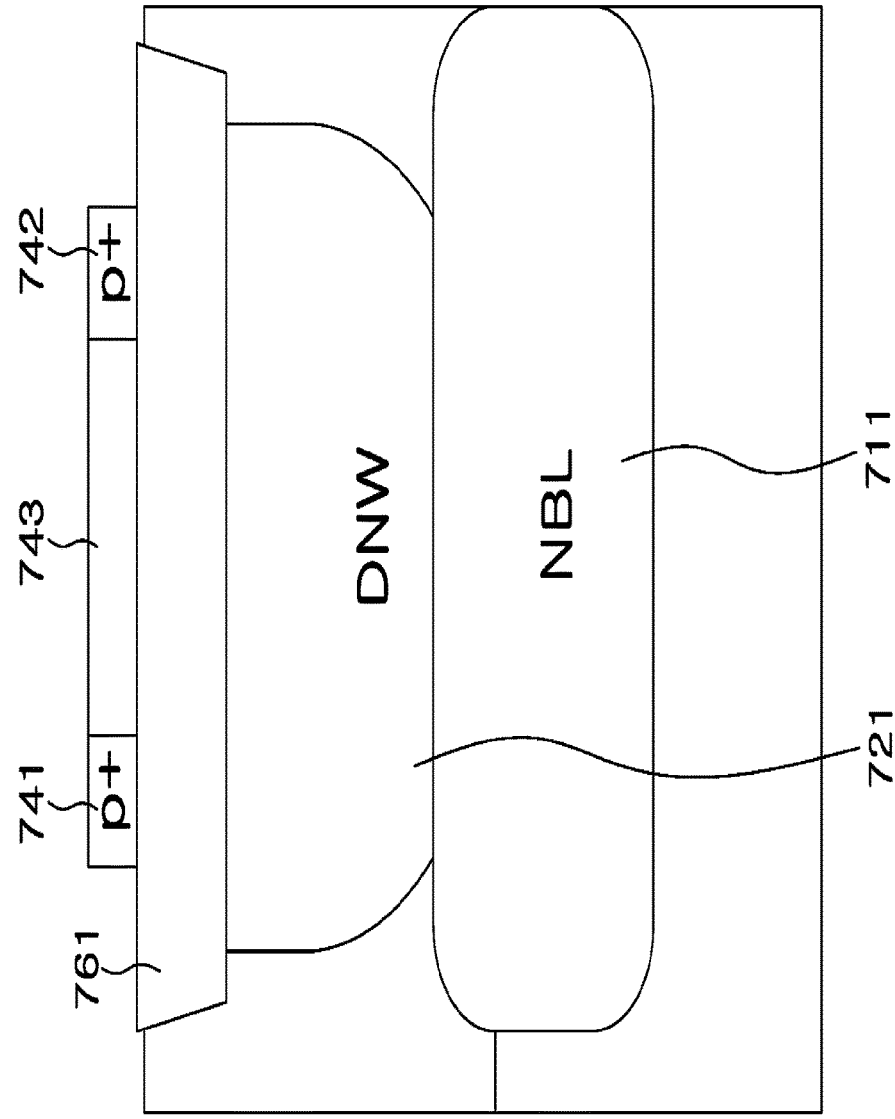

FIGS. 9A and 9B are respectively a cross-sectional view of a varactor 600 and a poly resistor 700 included in an integrated semiconductor device 1000 according to an example.

As illustrated in the examples of FIGS. 9A and 9B, a varactor 600 or a poly-resistor 700 may be further included with an RF CMOS transistor 100.

As illustrated in the example of FIG. 9A, a varactor 600 includes a deep doping layer of the first conductivity type 611, a deep well region of the first conductivity type 621, a source region 642 and a drain region 641 of a first conductivity type, and a gate electrode 643. In the example of FIG. 9A, the conductivity type of the source region 642 and the drain region 641 is identical to the conductivity type of the deep well region of the first conductivity type. A deep doping layer 611 is formed on the semiconductor substrate 11. The deep well region 621 of a first conductivity type is formed on the deep doping layer 611. The drain and source regions of a first conductivity type 641, 642 are formed on the deep well region of a first conductivity type 621. The gate electrode 643 is formed between the drain and source regions 642, 642. Also, an isolation structure 661 is formed on the varactor 600.

As illustrated in the example of FIG. 9B, poly resistor 700 includes a deep doping layer of the first conductivity type 711, a deep well region of the first conductivity type 721, and an insulation film 761. The deep doping layer of a first conductivity type 711 is formed on the semiconductor substrate 11. The deep well region 721 is formed on the deep doping layer of a first conductivity type 711. The insulation film 761 is formed on the deep well region 721. In the example of FIG. 9B, the insulation film 761 is formed using an insulation film of a trench-type or a LOCOS film. Also, in such an example, a poly silicone resistance region 743 made of poly silicone is formed on the insulation film 761. Additionally, highly doped regions of a second conductivity type 741, 742 are formed on both ends of a poly silicone film.

FIG. 10 is a cross-sectional view of an inductor comprised in the integrated semiconductor device according to an example.

As illustrated in the example of FIG. 10, an RF CMOS transistor 100 further includes an inductor 800. The inductor 800 includes an interlayer insulation film 13, a lower metal layer 820, upper layers 830, 832, 834 and a protection layer. The interlayer insulation film 13 is formed on the semiconductor substrate 11. The upper metal layers 832, 834 are formed on the upper part of the lower metal layer 820, and are connected to each other through via plugs 825, 827. Besides the inductor structure, a capacitor may be formed on the semiconductor substrate 11.

Figure 11A:
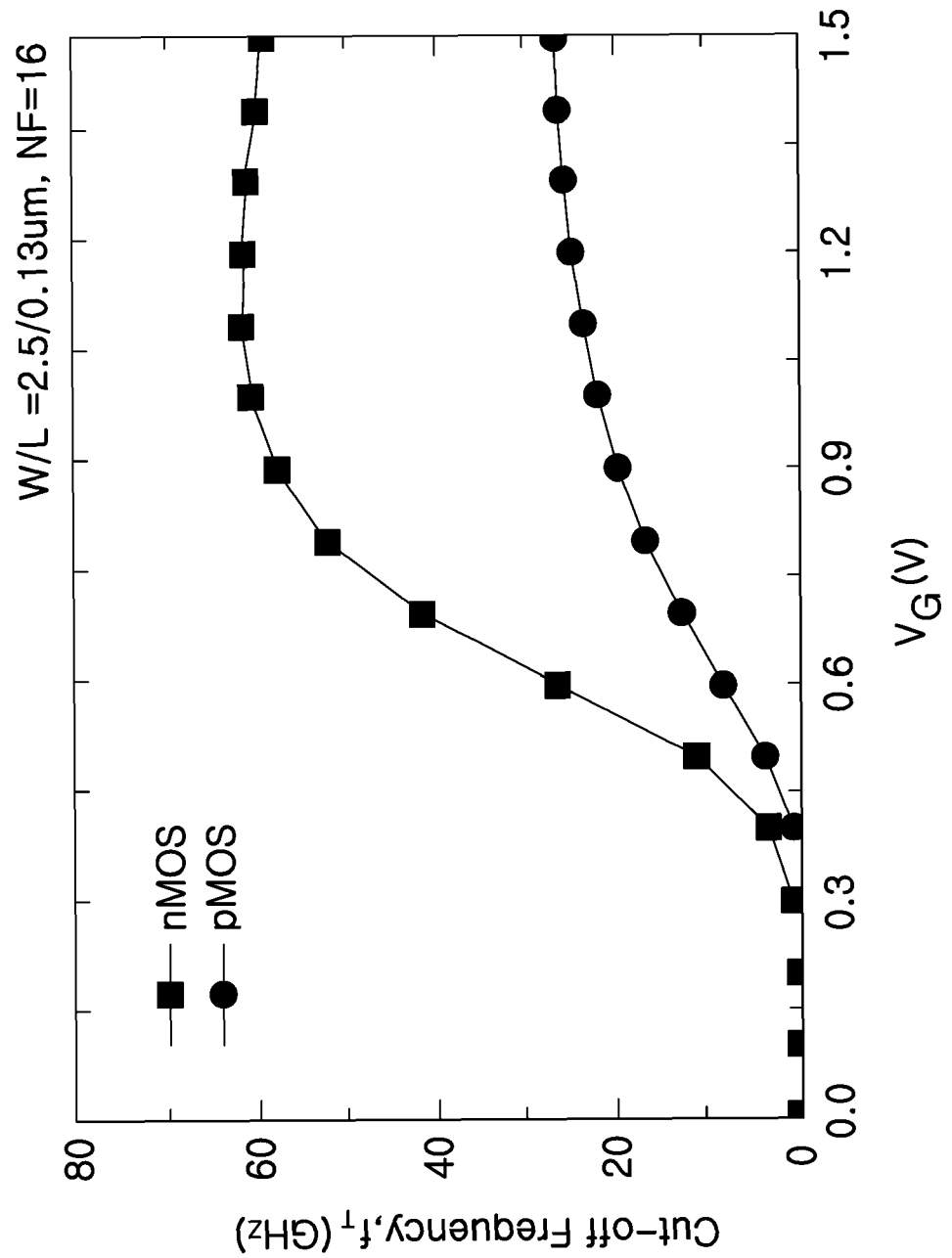
FIGS. 11A and 11B are drawings illustrating features of an RF CMOS transistor included in an integrated semiconductor device according to an example.
Figure 11B:
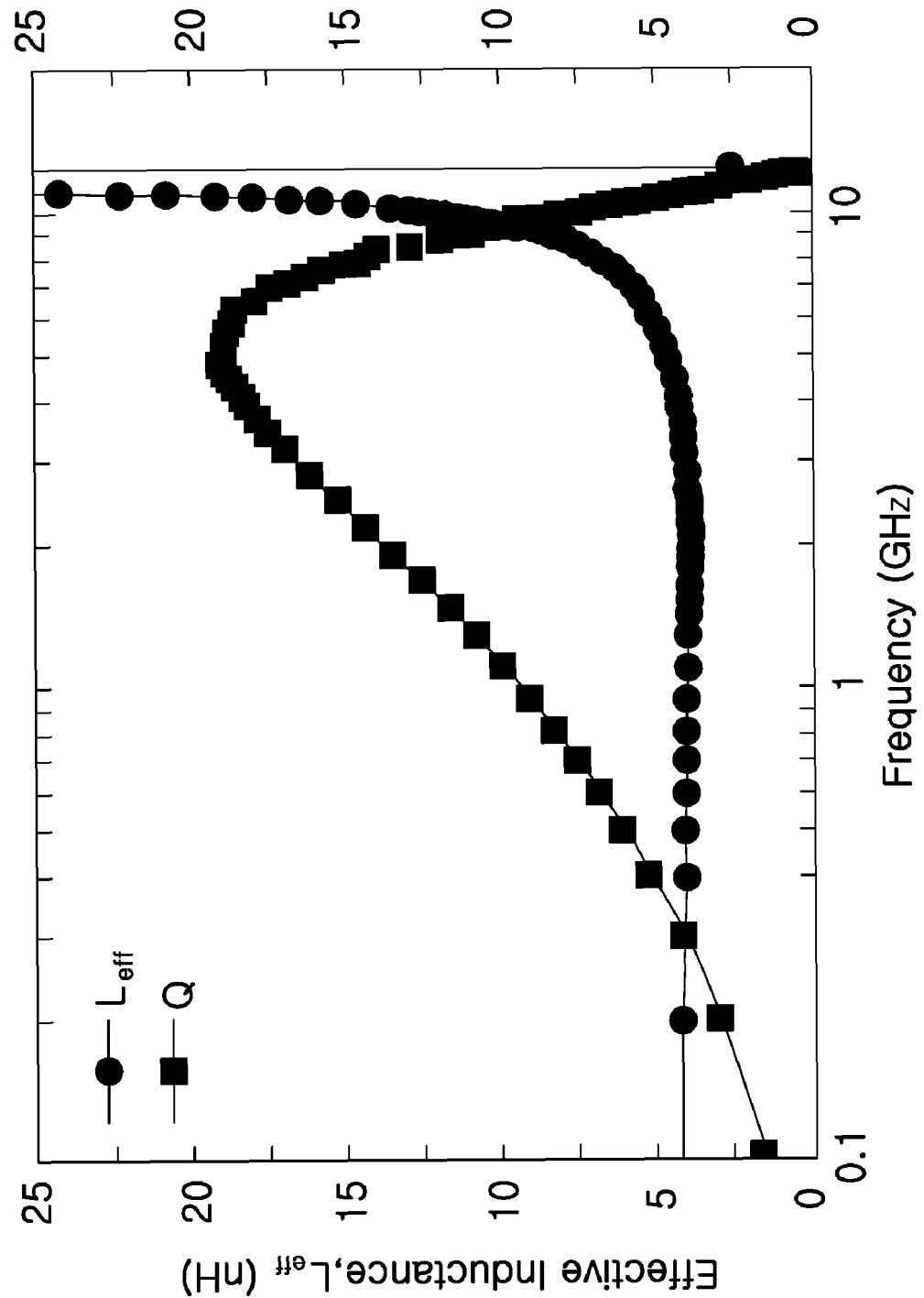

FIGS. 11A and 11B are drawings illustrating features of an RF CMOS transistor included in an integrated semiconductor device according to an example.

Specifically, FIG. 11A illustrates the RF feature of an nMOS device and a pMOS device included in an RF CMOS transistor 100 according to an example. FIG. 11A illustrates the RF feature of RF CMOS transistors, namely the nMOS device and the pMOS device, that have the structures illustrated in FIG. 4 or FIG. 5, according o the examples. The width and the length of these examples are, respectively, 2.5 and 0.13 µm. The cutoff frequency is enough to be used in a high frequency RF CMOS transistor. This phenomenon is, as explained above, based on the result of blocking noise elements flowing into the RF CMOS transistor by using a first junction guard ring 500 or isolation structures of a trench-type 550, 580 as provided in examples.

FIG. 11B illustrates the features of an inductor equipped with a metal layer of a predetermined thickness according to an example.

FIG. 11B illustrates the features of an inductor 800 equipped with a metal layer of a predetermined thickness, for example, 4 µm. The features are measured in the symmetrical structure with a Patterned Ground Shield (PGS) pattern to eliminate eddy current from the substrate 11. The magnetic resonance frequency is more than 5 GHz and the quality factor is more than 15, and the example therefore has appropriate features for wireless apparatuses. These properties are, as explained above, based on the result of blocking eddy currents elements derived from noise elements flowing into the RF CMOS transistor by using a first junction guard ring 500 or isolation structures of a trench-type 550, 580.

Figure 12A:
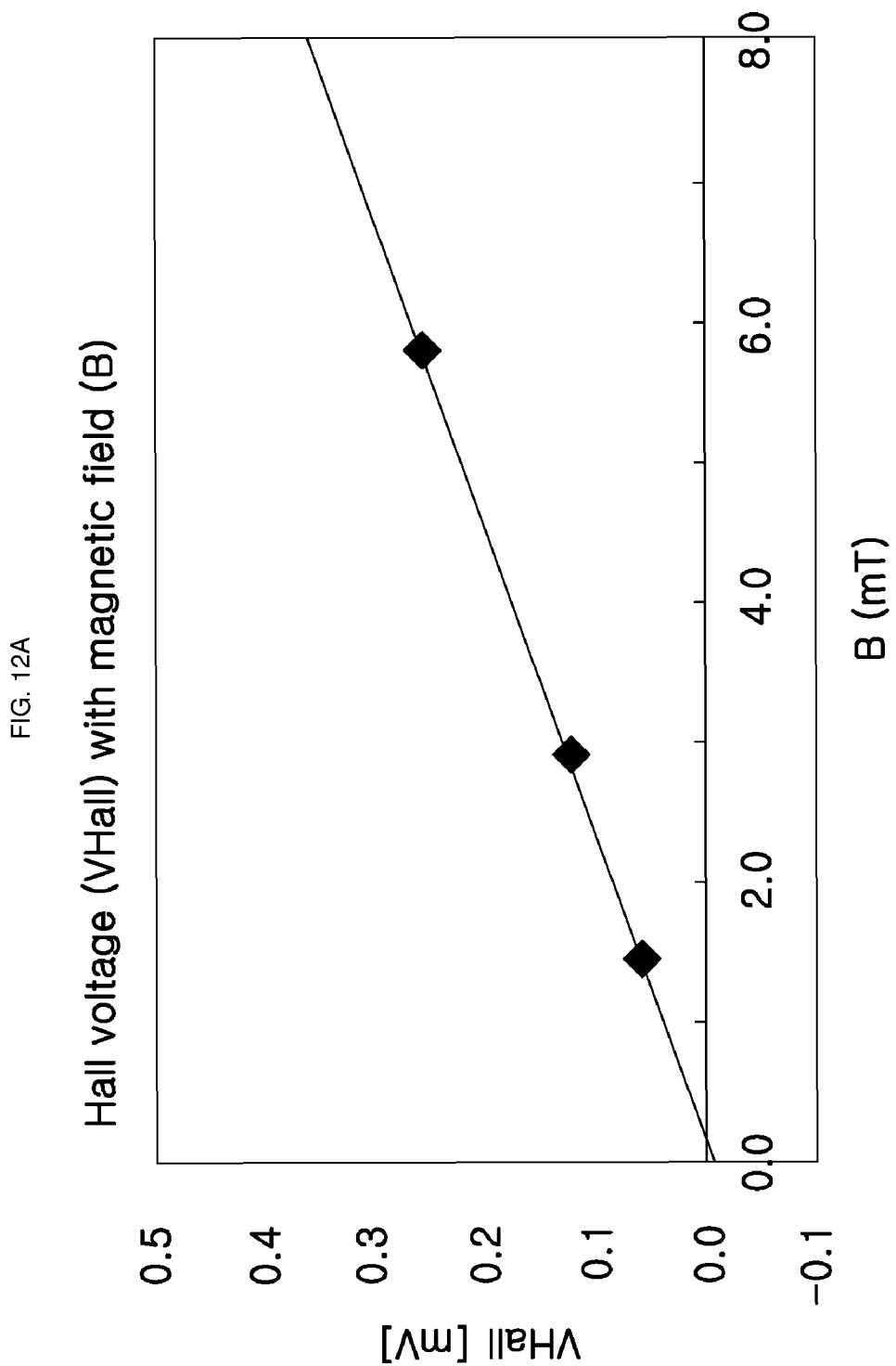
FIGS. 12A and 12B are drawings illustrating features of a Hall sensor included in an integrated semiconductor device according to an example.
Figure 12B:
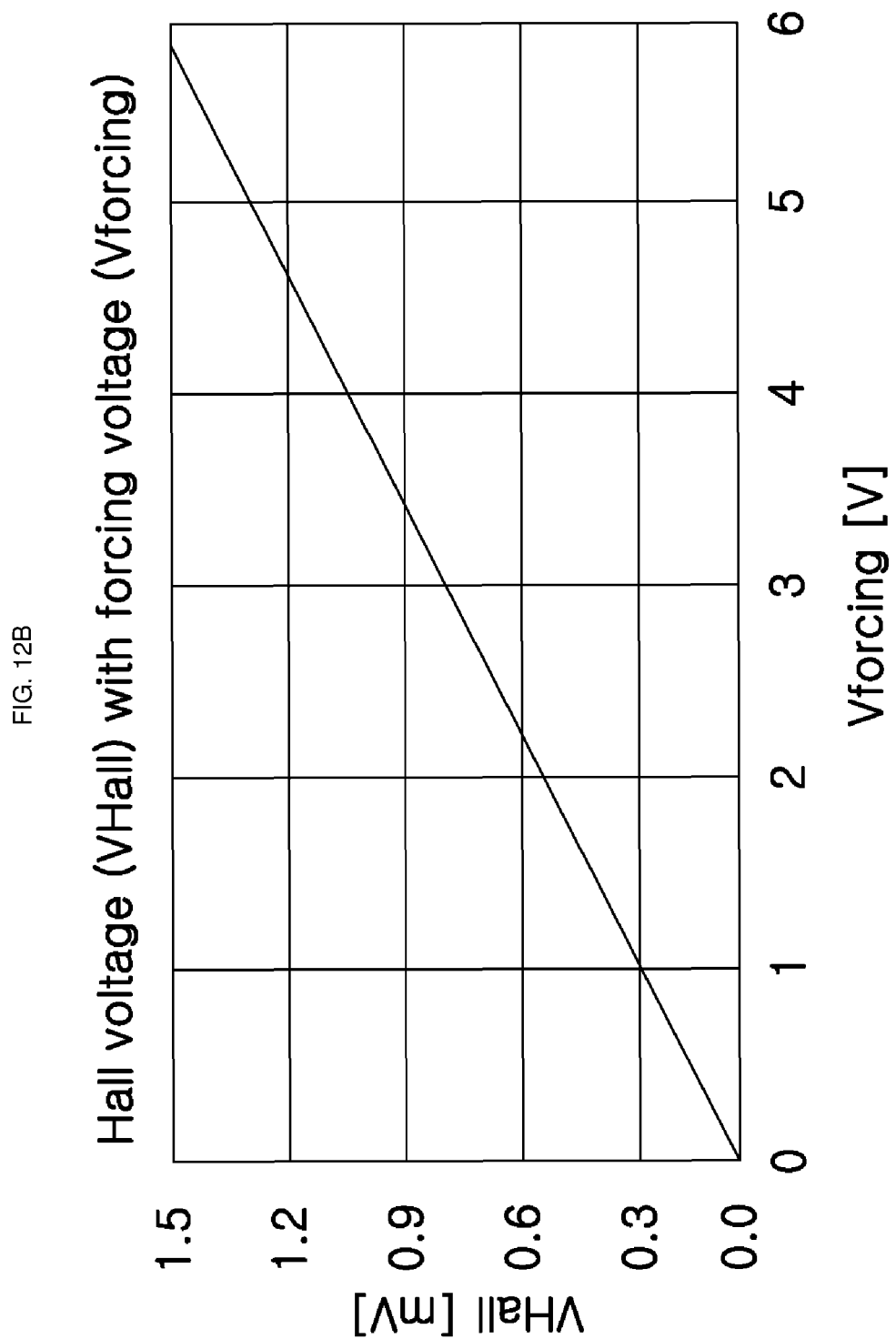

FIG. 12A and FIG. 12B are drawings illustrating the features of a Hall sensor included in the integrated semiconductor device according to an example.

Specifically, FIG. 12A illustrates that Hall voltage has a magnetic field and a high linearization coefficient. FIG. 12B is a drawing illustrating that the measured Hall voltage is proportionate to forced voltage. As illustrated in FIG. 12A and FIG. 12B, the examples' Hall voltage has a high linearization coefficient for the magnetic field and the forced voltage. Such a phenomenon is, as explained above, based on the result of blocking noise elements flowing in the Hall sensor by using a junction guard ring or an isolation structure of a trench-type.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An integrated semiconductor device, comprising:
   a first transistor and a second transistor sensitive to noise formed on a semiconductor substrate; and
   an isolation structure located adjacent to the transistors, comprising
     deep trenches,
     trapping regions formed between the deep trenches, and
     trench bottom doping regions formed on an end of each of the deep trenches,
   wherein each of the trapping regions comprises
     a buried layer,
     a well region formed on the buried layer, and
     a highly doped region formed on the well region.

2. The integrated semiconductor device of claim 1,
   wherein the deep trenches comprise a first trench, a second trench, a third trench, and a fourth trench formed spaced apart from each other,
   wherein the trapping regions comprise
     a first trapping region formed between the first trench and the second trench,
     a second trapping region formed between the second trench and the third trench, and
     a third trapping region formed between the third trench and the fourth trench, and
   wherein the first trapping region and the third trapping region have a same depth.

3. The integrated semiconductor device of claim 1, wherein a trench bottom doping region contacts two trenches.

4. The integrated semiconductor device of claim 1,
   wherein the first transistor comprises either one or both of a Radio Frequency (RF) Complementary Metal-Oxide-Semiconductor (CMOS) transistor and a Hall sensor.

5. The integrated semiconductor device of claim 4,
   wherein the RF CMOS transistor comprises:
     a buried layer of a first conductivity type formed on the semiconductor substrate;
     a first well region of a second conductivity type and a second well region of the first conductivity type formed on the buried layer;
     a first RF MOSFET formed on the first well region; and
     a second RF MOSFET formed on the second well region.

6. The integrated semiconductor device of claim 5,
   wherein the buried layer of the RF CMOS transistor directly contacts one of the deep trenches.

7. The integrated semiconductor device of claim 4,
   wherein the Hall sensor comprises:
     a sensing region of a first conductivity type formed on the substrate;
     highly doped regions of the first conductivity type formed on the sensing region and located apart from each other;
     a highly doped upper region of a second conductivity type formed between the highly doped regions; and
     device isolation layers formed between each highly doped region and a corresponding highly doped upper region.

8. The integrated semiconductor device of claim 7, wherein the sensing region directly contacts one of the deep trenches.

9. The integrated semiconductor device of claim 1, wherein the second transistor comprises a Laterally Diffused Metal-Oxide Semiconductor (LDMOS) transistor or a non-volatile memory device.

10. The integrated semiconductor device of claim 9, wherein the LDMOS transistor comprises:
    a first drift region of a first conductivity type formed on the substrate;

a body region of a second conductivity type;
a source region formed in the body region; and
a first drain region formed in the first drift region.

11. The integrated semiconductor device of claim 1, wherein each of the deep trenches comprises a deep trench portion and a shallow trench portion formed overlapping with the deep trench portion.

12. An integrated semiconductor device, comprising:
a transistor formed on a semiconductor substrate;
an isolation structure surrounding the transistor, wherein the isolation structure comprises trenches comprising a first trench and a second trench formed apart from each other;
a first trapping region of a first conductivity type formed between the first and second trenches;
a second trapping region of a second conductivity type formed on a part of the first trench;
a third trapping region of the second conductivity type formed on a part of the second trench; and
a trench bottom doping region of the second conductivity type formed on an end of the trenches.

13. The integrated semiconductor device of claim 12, wherein the first trapping region comprises:
a buried layer;
a well region formed on the buried layer; and
a highly doped region formed on the well region.

14. The integrated semiconductor device of claim 12, wherein the second and third trapping regions respectively comprise a well region, and a highly doped region formed on the well region.

15. The integrated semiconductor device of claim 12, wherein the transistor comprises:
a Hall sensor, wherein the Hall sensor comprises
a sensing region formed on the substrate,
highly doped regions of the first conductivity type formed on the sensing region and located apart from each other,
a highly doped upper region of the second conductivity type formed between the highly doped regions, and
isolation layers formed between one of the highly doped regions and the highly doped upper region.

* * * * *